United States Patent
Kim et al.

(10) Patent No.: US 8,023,346 B2
(45) Date of Patent: Sep. 20, 2011

(54) SEMICONDUCTOR MEMORY DEVICE INCLUDING SIGNAL CONTROLLER CONNECTED BETWEEN MEMORY BLOCKS

(75) Inventors: Young-hun Kim, Seongnam-si (KR); Dong-hak Shin, Hwaseong-si (KR); Jin-seok Kwak, Hwaseong-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 159 days.

(21) Appl. No.: 12/576,284

(22) Filed: Oct. 9, 2009

(65) Prior Publication Data
US 2010/0091593 A1    Apr. 15, 2010

(30) Foreign Application Priority Data
Oct. 9, 2008   (KR) .................... 10-2008-0099347

(51) Int. Cl.
*G11C 7/00* (2006.01)
(52) U.S. Cl. .................. 365/200; 365/189.08; 365/191; 365/225.7; 365/230.03
(58) Field of Classification Search ............ 365/189.08, 365/191, 200, 225.7, 230.03
See application file for complete search history.

(56) References Cited

U.S. PATENT DOCUMENTS 6,178,127 B1 * 1/2001 Haraguchi ............ 365/200
2004/0145959 A1 * 7/2004 Kuge et al. ............ 365/230.03

FOREIGN PATENT DOCUMENTS

| JP | 2004-342220   | 12/2004 |
| KR | 1020000057087 A | 9/2000 |
| KR | 1020070081698 A | 8/2007 |

* cited by examiner

*Primary Examiner* — Hoai V Ho
(74) *Attorney, Agent, or Firm* — Volentine & Whitt, PLLC

(57) ABSTRACT

A semiconductor memory device includes a first memory block, a second memory block, and a signal controller. The first memory block is configured to generate a first blocking signal, a second blocking signal, and a first enable signal in response to a row address, and to block and enable wordlines of the memory block in response to the first blocking signal and the first enable signal, respectively. The second memory block is configured to generate a third blocking signal, a fourth blocking signal, and a second enable signal in response to the row address, and to block and enable wordlines of the second memory block in response to the third blocking signal and the second enable signal, respectively. The signal controller is connected between the first memory block and the second memory block and is configured to enable the third blocking signal when the second blocking signal is enabled, and to enable the first blocking signal when the fourth blocking signal is enabled.

10 Claims, 3 Drawing Sheets

SEMICONDUCTOR MEMORY DEVICE INCLUDING SIGNAL CONTROLLER CONNECTED BETWEEN MEMORY BLOCKS

CROSS-REFERENCE TO RELATED APPLICATIONS

A claim of priority is made to Korean Patent Application No. 10-2008-0099347, filed Oct. 9, 2008, in the Korean Intellectual Property Office, the disclosure of which is incorporated herein in its entirety by reference.

BACKGROUND

The inventive concepts described herein relate to semiconductor memory devices, and more particularly, the inventive concepts relate to semiconductor memory devices in which redundancy wordlines are shared between memory blocks.

Semiconductor memory devices include a plurality of memory cells arranged in a matrix of rows and columns. Among the large numbers of memory cells within the matrix, some of the memory cells may be defective as the result of a variety of causes, including substrate imperfections, layout defects, processing defects, and the like. Rather than scraping the entire memory device when defects occur, yields can be improved by replacing a defective with a redundancy memory cell included within the device. Generally, repair operations of this type are carried out by enabling a redundancy wordline in lieu of a wordline containing one or more defective memory cells.

SUMMARY

According to an aspect of the inventive concepts described herein, a semiconductor memory device is provided which includes a first memory block, a second memory block, and a signal controller. The first memory block is configured to generate a first blocking signal, a second blocking signal, and a first enable signal in response to a row address, and to block and enable wordlines of the memory block in response to the first blocking signal and the first enable signal, respectively. The second memory block is configured to generate a third blocking signal, a fourth blocking signal, and a second enable signal in response to the row address, and to block and enable wordlines of the second memory block in response to the third blocking signal and the second enable signal, respectively. The signal controller is connected between the first memory block and the second memory block and is configured to enable the third blocking signal when the second blocking signal is enabled, and to enable the first blocking signal when the fourth blocking signal is enabled.

BRIEF DESCRIPTION OF THE DRAWINGS

The above and other aspects and features of the inventive concepts described herein will become readily apparent from the detailed description that follows, with reference to the accompanying drawings, in which.

DETAILED DESCRIPTION OF THE EMBODIMENTS

Figure 1:
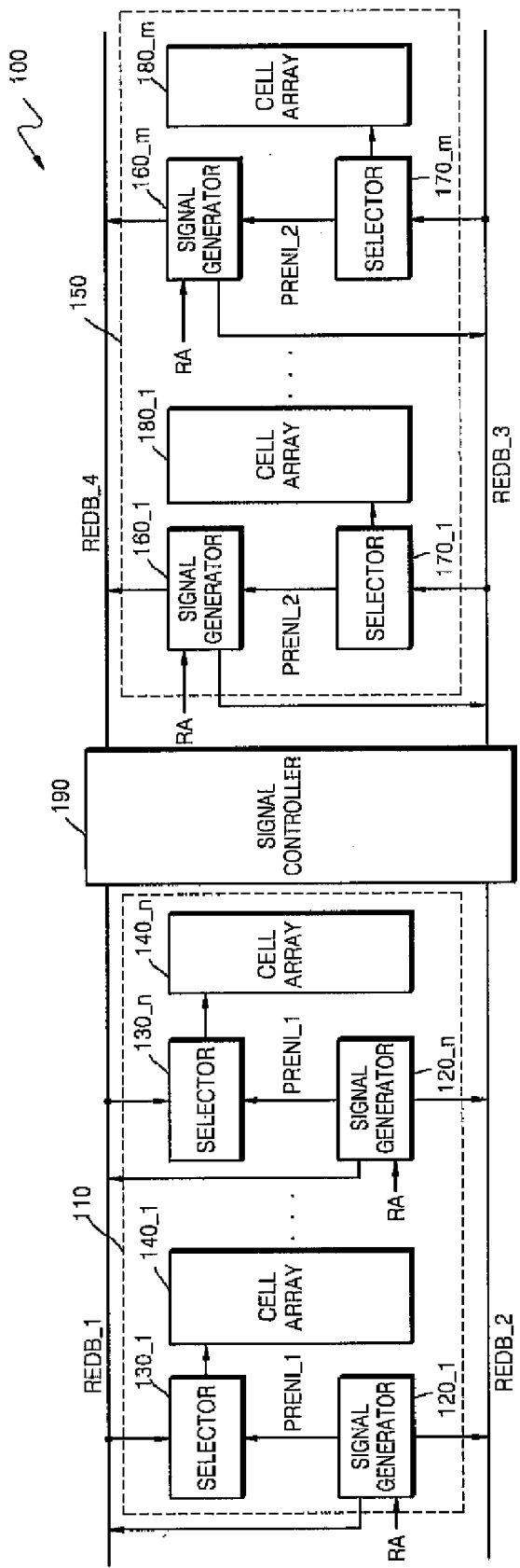
FIG. 1 is a block diagram of a semiconductor memory device according to an embodiment of one or more inventive concepts.

The inventive concepts will now be described more fully with reference to the accompanying drawings, in which exemplary embodiments of the inventive concept are shown. The inventive concepts may, however, be embodied in many different forms and should not be construed as being limited to the embodiments set forth herein; rather, these embodiments are provided so that this disclosure will be thorough and complete, and will fully convey the concept of the invention to those skilled in the art. Like reference numerals in the drawings denote like elements, and thus their description will not be repeated.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

FIG. 1 is a block diagram of a semiconductor memory device 100 according to an embodiment of one or more inventive concepts described herein.

Referring to FIG. 1, the semiconductor memory device 100 of this example includes a first memory block 110, a second memory block 150, and a signal controller 190.

The first memory block 110 of this example generates a first blocking signal REDB_1, a second blocking signal REDB_2, and a first enable signal PRENI_1 in response to a row address RA, and blocks or enables wordlines in accordance with the first blocking signal REDB_1 or the first enable signal PRENI_1, respectively.

The second memory block 150 of this example generates a third blocking signal REDB_3, a fourth blocking signal REDB_4, and a second enable signal PRENI_2 in response to the row address RA, and blocks or enables wordlines in accordance with the third blocking signal REDB_3 or the second enable signal PRENI_2, respectively.

The signal controller 190 of this example is connected between the first memory block 110 and the second memory block 150, and controls the third blocking signal REDB_3 to be enabled when the second blocking signal REDB_2 is enabled, and controls the first blocking signal REDB_1 to be enabled when the fourth blocking signal REDB_4 is enabled.

In other words, for example, when wordlines of the second memory block 150 including a defect are replaced with redundancy wordlines of the first memory block 110, the first memory block 110 enables the second blocking signal REDB_2. When wordlines of the first memory block 110 including a defect are replaced with redundancy wordlines of the second memory block 150, the second memory block 150 enables the fourth blocking signal REDB_4.

The first memory block 110 in the example of FIG. 1 includes cell arrays 140_1 through 140_n, signal generators 120_1 through 120_n, and selectors 130_1 through to 130_n, where n is an integer of one or more. In the example of this embodiment, each of the n signal generators 120_1 through to 120_n and the n selectors 130_1 through to 130_n perform the same operations, and thus, operations of the signal generator 120_1 and the selector 130_1 are described below.

The signal generator 120_1 of this embodiments generates the first blocking signal REDB_1, the second blocking signal REDB_2, and the first enable signal PRENI_1. The first blocking signal REDB_1 is enabled when a defect occurs in wordlines of the first memory block 110 corresponding to the row address RA and is disabled when a defect does not occur in the wordlines of the first memory block 110 corresponding to the row address RA.

The second blocking signal REDB_2 is enabled when a defect occurs in wordlines of the second memory block 150 corresponding to the row address RA and the wordlines of the second memory block 150 are replaced with redundancy wordlines of the first memory block 110. Also, the second blocking signal REDB_2 is disabled when a defect does not occur in wordlines of the second memory block 150 corresponding to the row address RA or when a defect occurs in the wordlines of the of the second memory block 150 corresponding to the row address RA and the wordlines of the second memory block 150 are replaced with redundancy wordlines of the second memory block 150.

The first enable signal PRENI_1 is used to enable the redundancy wordlines of the first memory block 110. In other words, when the first blocking signal REDB_1 is enabled, all of the wordlines of the first memory block 110 are blocked. However, when the first enable signal PRENI_1 is enabled, even though the first blocking signal REDB_1 is enabled, the redundancy wordlines of the first memory block 110, corresponding to the first enable signal PRENI_1, are enabled.

The second memory block 150 may include at least one of cell arrays 180_1, through to 180_m, at least one of signal generators 160_1, through to 160_m, and at least one of selectors 170_1, through to 170_m. In FIG. 1, there are m (where m is a natural number) cell arrays 180_1, through to 180_m, m signal generators 160_1, through to 160_m, and m selectors 170_1, through to 170_m. The m signal generators 160_1, through to 160_m and the m selectors 170_1, through to 170_m perform the same operations, and thus, operations of the signal generator 160_1 and the selector 170_1 will be described together.

The signal generator 160_1 may generate the third blocking signal REDB_3, the fourth blocking signal REDB_4, and the second enable signal PRENI_2. The third blocking signal REDB_3 is enabled when a defect occurs in the wordlines of the second memory block 150 corresponding to the row address RA and is disabled when a defect does not occur in the wordlines of the second memory block 150 corresponding to the row address RA.

The fourth blocking signal REDB_4 is enabled when a defect occurs in the wordlines of the first memory block 110 corresponding to the row address RA and the wordlines of the first memory block 110 are replaced with redundancy wordlines of the second memory block 160. Also, the fourth blocking signal REDB_4 is disabled when a defect does not occur in wordlines of the first memory block 110 corresponding to the row address RA or a defect occurs in the wordlines of the first memory block 110 corresponding to the row address RA and the wordlines of the first memory block 110 are replaced with the redundancy wordlines of the first memory block 110.

The second enable signal PRENI_2 is used to enable the redundancy wordlines of the second memory block 150. In other words, when the third blocking signal REDB_3 is enabled, all of the wordlines of the second memory block 150 are blocked. However, when the second enable signal PRENI_2 is enabled, even though the third blocking signal REDB_3 is enabled, the redundancy wordlines of the second memory block 150, corresponding to the second enable signal PRENI_2, are enabled.

A memory bank is formed by combining the cell arrays 140_1, through to 140_n of the first memory block 110 and the cell arrays 180_1, through to 180_m of the second memory block 150.

Hereinafter, an operation of the semiconductor memory device 100 according to an embodiment will be described with reference to FIG. 1.

For example, assuming that a defect occurs in wordlines of the cell array 140_1 of the first memory block 110 and the wordlines of the cell array 140_1 of the first memory block 110 should be replaced with redundancy wordlines of the cell array 140_n of the first memory block 110, when the row address RA is input to the wordlines of the cell array 140_1 in which a defect occurs, the signal generator 120_n outputs the first blocking signal REDB_1 and the first enable signal PRENI_1. In other words, the first blocking signal REDB_1 and the first enable signal PRENI_1 are enabled. Since the first blocking signal REDB_1 is enabled, the selector 130_1 blocks the wordlines of the cell array 140_1 in which a defect occurs, and the selector 130_n enables redundancy wordlines in response to the first enable signal PRENI_1.

Next, assuming that a defect occurs in the wordlines of the cell array 140_1 of the first memory block 110 and the wordlines of the cell array 140_1 of the first memory block 110 should be replaced with redundancy wordlines of the cell array 180_m of the second memory block 150, when the row address RA is input to the wordlines of the cell array 140_1 in which a defect occurs, the signal generator 160_M outputs the fourth blocking signal REDB_4 and the second enable signal PRENI_2. In other words, the fourth blocking signal REDB_4 and the second enable signal PRENI_2 are enabled. Since the fourth blocking signal REDB_4 is enabled, the signal generator 190 controls the first blocking signal REDB_1 to be enabled. Since the first blocking signal REDB_1 is enabled, the selector 130_1 blocks the wordlines of the cell array 140_1 in which a defect occurs, and the selector 170_m enables redundancy wordlines in response to the second enable signal PRENI_2.

Hereinafter, the case when two wordlines are enabled, i.e., the case when wordlines of the first memory block 110 are enabled and wordlines of the second memory block 150 are enabled will be described.

For example, wordlines of the cell array 140_1 of the first memory block 110 and wordlines of the cell array 180_1 of the second memory block 150 should be enabled. Assuming that a defect occurs in the wordlines of the cell array 180_1 of the second memory block 150 and the wordlines of the cell array 180_1 of the second memory block 150 should be replaced with redundancy wordlines of the cell array 180_m of the second memory block 150, the remaining bits excluding a most significant bit (MSB) of the row address RA may be used. For example, the case when the MSB of the row address RA is '0' is referring to the first memory block 110, and the case when the MSB of the row address RA is '1' is referring to the second memory block 150. In this case, the row address RA that ignores the MSB corresponds to a wordline of the first memory block 110 and a wordline of the second memory block 150. Hereinafter, the row address RA in the case when two wordlines are enabled means the remaining bits excluding the MSB.

In the first memory block 110, there is no defect in the wordlines of the cell array 140_1 and thus, a corresponding wordline is enabled. However, in the second memory block 150, a defect occurs in the wordlines of the cell array 180_1 corresponding to the row address RA, and thus, the signal generator 160_m outputs the third blocking signal REDB_3 and the second enable signal PRENI_2. In other words, the third blocking signal REDB_3 and the second enable signal PRENI_2 are enabled. Since the third blocking signal REDB_3 is enabled, the selector 170_1 blocks the wordlines of the cell array 180_1 in which a defect occurs, and the selector 170_m enables a corresponding redundancy wordline in response to the second enable signal PRENI_2.

Next, the wordlines of the cell array 140_1 of the first memory block 110 and the wordlines of the cell array 180_1 of the second memory block 150 should be enabled. Assuming that a defect occurs in the wordlines of the cell array 180_1 of the second memory block 150 and the wordlines of the cell array 180_1 of the second memory block 150 should be replaced with redundancy wordlines of the cell array 140_n of the first memory block 110, the remaining bits excluding the MSB of the row address RA may be used, as described above.

In the first memory block 110, there is no defect in the wordlines of the cell array 140_1 and thus, corresponding wordlines are enabled. However, in the second memory block 150, a defect occurs in the wordlines of the cell array 180_1 corresponding to the row address RA, and thus, the signal generator 120_n outputs the second blocking signal REDB_2 and the first enable signal PRENI_1. In other words, the second blocking signal REDB_2 and the first enable signal PRENI_1 are enabled. Since the second blocking signal REDB_2 is enabled, the signal controller 190 controls the third blocking signal REDB_3 to be enabled. Since the third blocking signal REDB_3 is enabled, the selector 170_1 blocks the wordlines of the cell array 180_1 in which a defect occurs, and the selector 130_n enables corresponding redundancy wordlines in response to the first enable signal PRENI_1.

Figure 2:
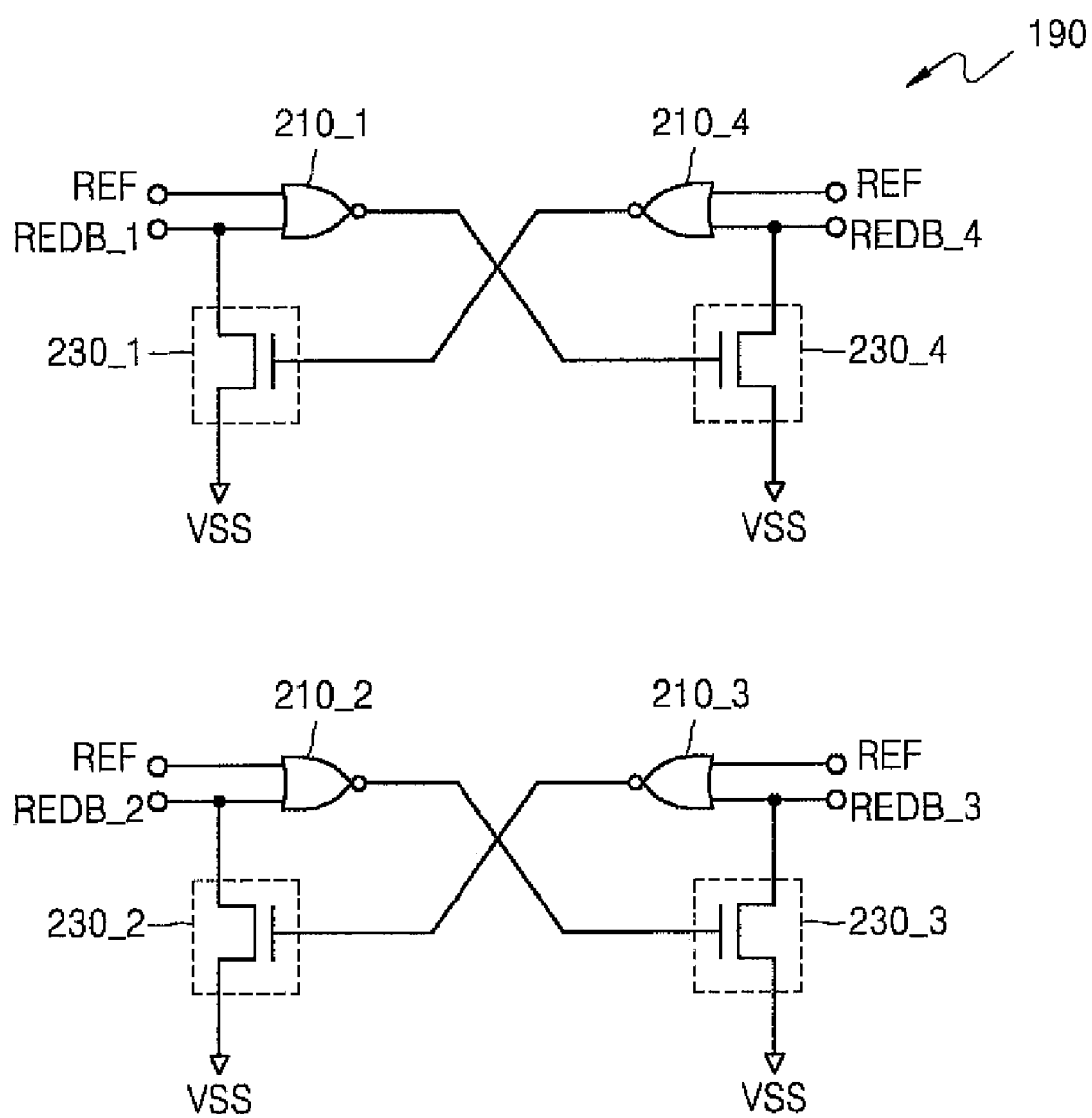
FIG. 2 illustrates a signal controller of the semiconductor memory device illustrated in FIG. 1, according to an embodiment of one or more inventive concepts.

FIG. 2 illustrates a non-limiting example of the signal controller 190 of the semiconductor memory device 100 shown in FIG. 1.

The signal controller 190 of the example of FIG. 2 includes a first NOR gate 210_1, a second NOR gate 210_2, a third NOR gate 210_3, a fourth NOR gate 210_4, a first transistor 230_1, a second transistor 230_2, a third transistor 230_3, and a fourth transistor 230_4.

The first NOR gate 210_1 outputs the logic NOR of a reference signal REF and the first blocking signal REDB_1 input thereto. The second NOR gate 210_2 outputs the logic NOR of the reference signal REF and the second blocking signal REDB_2 input thereto. The third NOR gate 210_3 outputs the logic NOR of the reference signal REF and the third blocking signal REDB_3 input thereto. The fourth NOR gate 210_4 outputs the logic NOR of the reference signal REF and the fourth blocking signal REDB_4 input thereto. The first blocking signal REDB_1 is applied to a first terminal of the first transistor 230_1, and a ground voltage VSS is applied to a second terminal of the first transistor 230_1, and an output of the fourth NOR gate 210_4 is applied to a gate of the first transistor 230_1. The second blocking signal REDB_2 is applied to a first terminal of the second transistor 230_2, and the ground voltage VSS is applied to a second terminal of the second transistor 230_2, and an output of the third NOR gate 210_3 is applied to a gate of the second transistor 230_2. The third blocking signal REDB_3 is applied to a first terminal of the third transistor 230_3, and the ground voltage VSS is applied to a second terminal of the third transistor 230_3, and an output of the second NOR gate 210_2 is applied to a gate of the third transistor 230_3. The fourth blocking signal REDB_4 is applied to a first terminal of the fourth transistor 230_4, and the ground voltage VSS is applied to a second terminal of the fourth transistor 230_4, and an output of the first NOR gate 210_1 is applied to a gate of the fourth transistor 230_4.

When the semiconductor memory device 100 of FIG. 1 performs an active operation, the reference signal REF may, for example, be in a first logic state. On the other hand, when the semiconductor memory device 100 of FIG. 1 performs a precharge operation, the reference signal REF may, for example, be in a second logic state which is different then the first logic states. Hereinafter, it is assumed for the sake of description only that that the first logic state is a logic LOW state and the second logic state is a logic HIGH state. However, the inventive concepts described herein are not limited thereto, and the logic state of the reference signal REF may be changed as necessary.

The signal controller of FIG. 2 operates, for example, to enable the third blocking signal REDB_3 when the second blocking signal REDB_2 is enabled, and to enable the first blocking signal REDB_1 when the fourth blocking signal REDB_4 is enabled.

In the specific example of FIG. 2, the first through fourth blocking signals REDB_1, REDB_2, REDB_3, and REDB_4 are enabled when in the first (LOW) logic state.

For example, when the second blocking signal REDB_2 is enabled (LOW) and the reference signal REF is in the first (LOW) logic state, the output of the NOR gate 210_2 is HIGH and the third transistor 230_3 is turned ON, and thus, the third blocking signal REDB_3 is in the first (LOW) logic state and is enabled. Also, when the fourth blocking signal REDB_4 is enabled and the reference signal REF is in the first (LOW) logic state, the first transistor 230_1 is turned ON, and thus, the first blocking signal REDB_1 is in the first (LOW) logic state and is enabled.

In FIG. 2, which is an embodiment of the signal generator 190 of FIG. 1, four NOR gates 210_1, 210_2, 210_3, and 210_4 and four transistors 230_1, 230_2, 230_3, and 230_4 are used. However, the signal controller 190 according to the inventive concepts described herein are not limited to specific example of FIG. 2.

Figure 3:
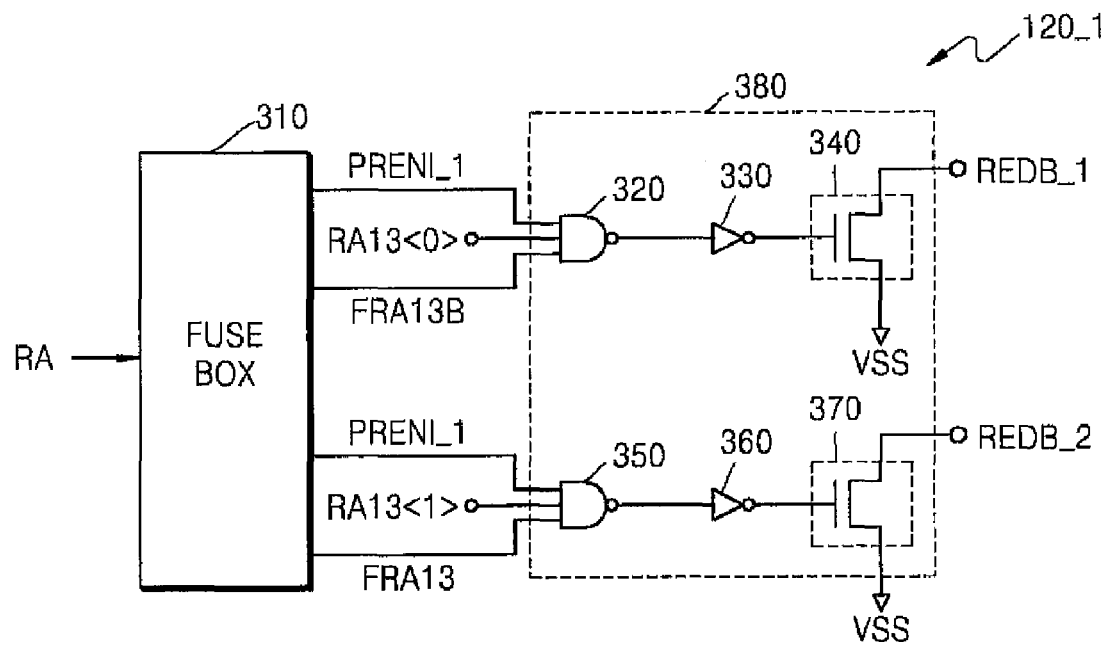
FIG. 3 illustrates a signal generator of a first memory block of the semiconductor memory device of FIG. 1, according to an embodiment of one or more inventive concepts.

FIG. 3 illustrates a non-limiting example of the signal generator 120_1 of the first memory block 110 of the semiconductor memory device 100 of FIG. 1. The remaining signal generators of the first memory block 110 may be similarly configured.

Referring to FIGS. 1 and 3, the signal generator 120_1 of this example includes a fuse box 310 and a blocking signal generator 380. The fuse box 310 generates the first enable signal PRENI_1 and fuse information signals FRA13B and FRA13 by using the row address RA and a fuse (not shown), and outputs the first enable signal PRENI_1 and fuse information signals FRA13B and FRA13. The first enable signal PRENI_1 is enabled when the row address RA and fuse information do not coincide with each other, i.e., when the row address RA of the wordlines in which a defect occurs and the fuse information do not coincide with each other. The fuse information signal RFA13B is enabled when the row address RA and the fuse information coincide with each other, i.e., when the wordlines corresponding to the row address RA are included in the first memory block 110. The fuse information signal FRA13B is enabled when the row address RA and the fuse information coincide with each other, i.e., when the wordlines corresponding to the row address RA are included in the second memory block 150. Thus, the fuse information signal FRA13B and the fuse information signal FRA13 always have opposite logic states. In other words, when the fuse information signal FRA13B is enabled, the fuse information signal FRA13 is disabled, and when the fuse information signal FRA13 is enabled, the fuse information signal FRA13B is disabled.

The blocking signal generator 380 outputs the first blocking signal REDB_1 or the second blocking signal REDB_2 by using the first enable signal PRENI_1, block indication signals RA13<0> and RA13<1> and the fuse information signals FRA13 and FRA13B. The block indication signals RA13<0> and RA13<1> indicate that the wordlines corresponding to the row address RA are included in the first memory block 110 or the second memory block 150. For example, when the wordlines corresponding to the row address RA are included in the first memory block 110, the block indication signal RA13<0> may be enabled, and when the wordlines corresponding to the row address RA are included in the second memory block 150, the block indication signal RA13<1> may be enabled. The block indication signals RA13<0> and RA13<1> may be enabled or disabled by using the MSB of the row address RA, as described above. As in the previous example, assuming that the case when the MSB of the row address RA is '0' refers to the first memory block 110 and the case when the MSB of the row address RA is '1' refers to the second memory block 150, when the MSB of the row address RA is '0', the block indication signal RA13<0> is enabled, and when the MSB of the row address RA is '1', the block indication signal RA13<1> is enabled. When two wordlines are enabled, all of the block indication signals RA13<0> and RA13<1> are enabled.

The blocking signal generator 380 of this example include a first NAND gate 320, a first inverter 330, a first transistor 340, a second NAND gate 350, a second inverter 360, and a second transistor 370. The first NAND gate 320 performs a NAND operation by using the first enable signal PRENI_1, the block indication signal RA13<0>, and the fuse information signal FRA13B as input signals and outputs the result of the NAND operation. The first inverter 330 inverts an output of the first NAND gate 320 and outputs the result of the inversion operation. A gate of the first transistor 340 is connected to an output terminal of the first inverter 330, and the ground voltage VSS is applied to a first terminal of the first transistor 340, and a second terminal of the first transistor 340 outputs the first blocking signal REDB_1. The second NAND gate 350 performs a NAND operation by using the first enable signal PRENI_1, the block indication signal RA13<1>, and the fuse information signal FRA13 as input signals and outputs the result of the NAND operation. The second inverter 360 inverts an output of the second NAND gate 340 and outputs the result of the inversion operation. A gate of the second transistor 370 is connected to an output terminal of the second inverter 360, and the ground voltage VSS is applied to a first terminal of the second transistor 370, and a second terminal of the second transistor 370 outputs the second blocking signal REDB_2.

The inventive concepts described herein are not limited to the specific example of the embodiment of FIG. 3. When a defect occurs in wordlines of the first memory block 110 and the wordlines of the first memory block 110 are replaced with redundancy wordlines of the first memory block 110, the first blocking signal REDB_1 is enabled. Also, when a defect occurs in wordlines of the second memory block 150 and the wordlines of the second memory block 150 are replaced with redundancy wordlines of the first memory block 110, the second blocking signal REDB_2 may be enabled.

For example, when the row address RA is input to wordlines of the cell array 140_n including a defect and the redundancy wordlines are included in the cell array 140_1, the first enable signal PRENI_1, the fuse information signal FRA13B, and the block indication signal RA13<0> are enabled, and the fuse information signal FRA13 and the block indication signal RA13<1> are disabled. In FIG. 3, the first enable signal PRENI_1, the fuse information signals FRA13B and FRA13, and the block indication signal RA13<0> are disabled when they are in the first logic state and are enabled when they are in the second logic state. Since the first enable signal PRENI_1, the fuse information signal FRA13B, and the block indication signal RA13<0> are enabled and are in the second logic state, an output signal of the first NAND gate 320 is in the first logic state, an output signal of the first inverter 330 is in the second logic state, and the first transistor 340 is turned ON. Thus, the first blocking signal REDB_1 is in the first logic state and is enabled.

On the other hand, since the fuse information signal FRA13 and the block indication signal RA13<1> are disabled and are in the first logic state, an output signal of the second NAND gate 350 is in the second logic state, an output signal of the second inverter 360 is in the first logic state, and the second transistor 370 is turned OFF. Thus, the second blocking signal REDB_2 is not enabled.

Next, when the row address RA is input to wordlines of the cell array 180_m including a defect and the redundancy wordlines are included in the cell array 140_1, the first enable signal PRENI_1, the fuse information signal FRA13, and the block indication signal RA13<1> are enabled, and the fuse information signal FRA13B and the block indication signal RA13<0> are disabled. Since the first enable signal PRENI_1, the fuse information signals FRA13, and the block indication signal RA13<1> are enabled and are in the second logic state, an output signal of the second NAND gate 350 is in the first logic state, an output signal of the second inverter 360 is in the second logic state, and the second transistor 370 is turned ON. Thus, the second blocking signal REDB_2 is in the first logic state and is enabled.

On the other hand, since the fuse information signal FRA13B and the block indication signal RA13<0> are disabled and are in the first logic state, the output signal of the first NAND gate 320 is in the second logic state, the output signal of the first inverter 330 is in the first logic state, and the first transistor 340 is turned OFF. Thus, the first blocking signal REDB_1 is not enabled.

Figure 4:
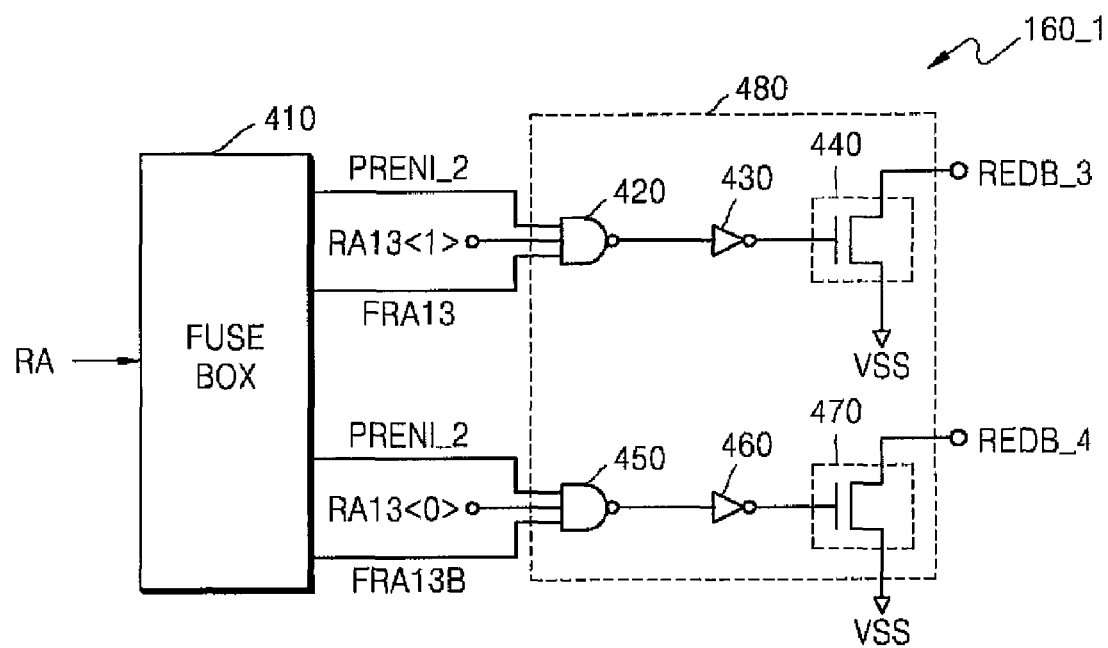
FIG. 4 illustrates a signal generator of a second memory block of the semiconductor memory device of FIG. 1, according to an embodiment of one or more inventive concepts.

FIG. 4 illustrates an example of the signal generator 160_1 of the second memory block 150 of the semiconductor memory device 100 of FIG. 1. The remaining signal generators of the second memory block 150 may be similarly configured.

Referring to FIGS. 1, 3, and 4, the signal generator 160_1 of this example includes a fuse box 410 and a blocking signal generator 480. The fuse box 410 operates in the same manner as the fuse box 310 of FIG. 3 and generates and outputs the second enable signal PRENI_2 and the fuse information signals FRA13B and FRA13, and thus, a detailed description thereof is omitted here to avoid redundancy. Also, the fuse information signals FRA13B and FRA13 and the block indication signals RA13<0> and RA13<1>, illustrated in FIG. 4, are the same as the fuse information signals FRA13B and FRA13 and the block indication signals RA13<0> and RA13<1> of FIG. 3, and thus, a detailed description thereof is omitted here to avoid redundancy.

The blocking signal generator 480 outputs the third blocking signal REDB_3 or the fourth blocking signal REDB_4 by using the second enable signal PRENI_2, the block indication signals RA13<0> and RA13<1>, and the fuse information signals FRA13 and FRA13B.

The blocking signal generator 480 of this specific example includes a first NAND gate 420, a first inverter 430, a first transistor 440, a second NAND gate 450, a second inverter 460, and a second transistor 470. The first NAND gate 420 performs a NAND operation by using the second enable signal PRENI_2, the block indication signal RA13<1>, and the fuse information signal FRA13 as input signals and outputs the result of the NAND operation. The first inverter 430 inverts an output of the first NAND gate 420 and outputs the result of the inversion operation. A gate of the first transistor 440 is connected to an output terminal of the first inverter 430, and the ground voltage VSS is applied to a first terminal of the first transistor 440, and a second terminal of the first transistor 440 outputs the third blocking signal REDB_3. The second NAND gate 450 performs a NAND operation by using the second enable signal PRENI_2, the block indication signal RA13<0>, and the fuse information signal FRA13B as input signals and output the result of the NAND operation. The second inverter 460 inverts an output of the second NAND gate 440 and outputs the result of the inversion operation. A gate of the second transistor 470 is connected to an output terminal of the second inverter 460, and the ground voltage VSS is applied to a first terminal of the second transistor 470, and a second terminal of the second transistor 470 outputs the fourth blocking signal REDB_4.

The inventive concepts herein are not limited to the specific example of the embodiment of FIG. 4. When a defect occurs in wordlines of the second memory block 150 and the wordlines of the second memory block 110 are replaced with redundancy wordlines of the second memory block 150, the third blocking signal REDB_3 is enabled, and when a defect occurs in wordlines of the first memory block 110 and the wordlines of the first memory block 110 are replaced with redundancy wordlines of the second memory block 150, the fourth blocking signal REDB_4 may be enabled.

For example, when the row address RA is input to wordlines of the cell array 180_n including a defect and the redundancy wordlines are included in the cell array 180_1, the second enable signal PRENI_2, the fuse information signal FRA13, and the block indication signal RA13<1> are enabled, and the fuse information signal FRA13B and the block indication signal RA13<0> are disabled. Also in FIG. 4, the second enable signal PRENI_2, the fuse information signals FRA13B and FRA13, and the block indication signals RA13<0> and RA13<1> are disabled when they are in the first logic state and are enabled when they are in the second logic state. Since the second enable signal PRENI_2, the fuse information signal FRA13, and the block indication signal RA13<1> are enabled and are in the second logic state, an output signal of the first NAND gate 420 is in the first logic state, an output signal of the first inverter 430 is in the second logic state, and the first transistor 440 is turned ON. Thus, the third blocking signal REDB_3 is in the first logic state and is enabled.

On the other hand, since the fuse information signal FRA13B and the block indication signal RA13<0> are disabled and are in the first logic state, an output signal of the second NAND gate 450 is in the second logic state, an output signal of the second inverter 460 is in the first logic state, and the second transistor 470 is turned OFF. Thus, the fourth blocking signal REDB_4 is not enabled.

Next, when the row address RA is input to wordlines of the cell array 140_n including a defect and the redundancy wordlines are included in the cell array 180_1, the second enable signal PRENI_2, the fuse information signal FRA13B, and the block indication signal RA13<0> are enabled, and the fuse information signal FRA13 and the block indication signal RA13<1> are disabled. Since the second enable signal PRENI_2, the fuse information signals FRA13B, and the block indication signal RA13<0> are enabled and are in the second logic state, an output signal of the second NAND gate 450 is in the first logic state, an output signal of the second inverter 460 is in the second logic state, and the second transistor 470 is turned ON. Thus, the third blocking signal REDB_3 is in the first logic state and is enabled.

On the other hand, since the fuse information signal FRA13 and the block indication signal RA13<1> are disabled and are in the first logic state, the output signal of the first NAND gate 420 is in the second logic state, the output signal of the first inverter 430 is in the first logic state, and the first transistor 440 is turned OFF. Thus, the third blocking signal REDB_3 is not enabled.

While inventive concepts have been particularly shown and described with reference to exemplary embodiments thereof, it will be understood that various changes in form and details may be made therein without departing from the spirit and scope of the following claims.

What is claimed is:

1. A semiconductor memory device comprising:
   a first memory block configured to generate a first blocking signal, a second blocking signal, and a first enable signal in response to a row address, and to block and enable wordlines of the first memory block in response to the first blocking signal and the first enable signal, respectively;
   a second memory block configured to generate a third blocking signal, a fourth blocking signal, and a second enable signal in response to the row address, and to block and enable wordlines of the second memory block in response to the third blocking signal and the second enable signal, respectively; and
   a signal controller connected between the first memory block and the second memory block and configured to enable the third blocking signal when the second blocking signal is enabled, and to enable the first blocking signal when the fourth blocking signal is enabled.

2. The semiconductor memory device of claim 1, wherein the first memory block enables the second blocking signal when wordlines of the second memory block are replaced with redundancy wordlines of the first memory block, and the second memory block enables the fourth blocking signal when wordlines of the first memory block are replaced with redundancy wordlines of the second memory block.

3. The semiconductor memory device of claim 1, wherein the first memory block comprises:
   a signal generator configured to output the first blocking signal that is enabled when a defect occurs in the wordlines of the first memory block corresponding to the row address, the second blocking signal that is enabled when a defect occurs in the wordlines of the second memory block corresponding to the row address and the wordlines of the second memory block are replaced with redundancy wordlines of the first memory block, and the first enable signal for enabling the redundancy wordlines of the first memory block; and
   a selector configured to enable only the redundancy wordlines among the wordlines of the first memory block and to block other remaining wordlines when the first blocking signal and the first enable signal are enabled.

4. The semiconductor memory device of claim 3, wherein the signal generator comprises:
   a fuse box configured to output the first enable signal and a fuse information signal according to the row address; and
   a blocking signal generator configured to output the first blocking signal or the second blocking signal according to the first enable signal, a block indication signal and the fuse information signal, wherein the block indication signal indicates whether the row address is included in the first memory block or the second memory block, and wherein the block indication signal is enabled when two wordlines are enabled.

5. The semiconductor memory device of claim 4, wherein the blocking signal generator comprises:
a first NAND gate which outputs a logic NAND of the first enable signal, the block indication signal that is enabled when the row address is included in the first memory block, and the fuse information signal;
a first inverter which inverts an output of the first NAND gate;
a first transistor including a gate connected to the output of the first inverter, a first terminal connected to a ground voltage, and a second terminal outputting the first blocking signal;
a second NAND gate which outputs a logic NAND of the first enable signal, the block indication signal that is enabled when the row address is included in the second memory block, and the fuse information signal;
a second inverter which inverts an output of the second NAND gate; and
a second transistor including a gate connected to the output of the second inverter, a first terminal connected to the ground voltage, and a second terminal outputting the second blocking signal.

6. The semiconductor memory device of claim 3, wherein the second memory block comprises:
a signal generator configured to output the third blocking signal that is enabled when a defect occurs in the wordlines of the second memory block corresponding to the row address, the fourth blocking signal that is enabled when a defect occurs in the wordlines of the first memory block corresponding to the row address and the wordlines of the first memory block are replaced with redundancy wordlines of the first memory block, and the second enable signal for enabling the redundancy wordlines of the second memory block; and
a selector configured to enable only the redundancy wordlines among the wordlines of the second memory block and to block other remaining wordlines when the third blocking signal and the second enable signal are enabled.

7. The semiconductor memory device of claim 6, wherein the signal generator comprises:
a fuse box configured to output the second enable signal and a fuse information signal according to the row address; and
a blocking signal generator configured to output the third blocking signal or the fourth blocking signal according to the second enable signal, a block indication signal and the fuse information signal, wherein the block indication signal indicates whether the row address is included in the first memory block or the second memory block, and wherein the block indication signal is enabled when two wordlines are enabled.

8. The semiconductor memory device of claim 7, wherein the blocking signal generator comprises:
a first NAND gate which outputs a logic NAND of the second enable signal, the block indication signal that is enabled when the row address is included in the second memory block, and the fuse information signal;
a first inverter which inverts an output of the first NAND gate;
a first transistor including a gate connected to the output of the first inverter, a first terminal connected to a ground voltage, and a second terminal outputting the third blocking signal;
a second NAND gate which outputs a logic NAND of the second enable signal, the block indication signal that is enabled when the row address is included in the first memory block, and the fuse information signal;
a second inverter which inverts an output of the second NAND gate; and
a second transistor including a gate connected to the output of the second inverter, a first terminal connected to the ground voltage, and a second terminal outputting the fourth blocking signal.

9. The semiconductor memory device of claim 1, wherein the signal generator comprises:
a first NOR gate which outputs a logic NOR of a reference signal and the first blocking signal;
a second NOR gate which outputs a logic NOR of the reference signal and the second blocking signal;
a third NOR gate which outputs a logic NOR of the reference signal and the third blocking signal;
a fourth NOR gate which outputs a logic NOR operation of the reference signal and the fourth blocking signal;
a first transistor including a gate connect to an output of the fourth NOR gate, a first terminal connected the first blocking signal, and a second terminal connected to a ground voltage;
a second transistor including a gate connect to an output of the third NOR gate, a first terminal connected the second blocking signal, and a second terminal connected to a ground voltage;
a third transistor including a gate connect to an output of the second NOR gate, a first terminal connected the third blocking signal, and a second terminal connected to a ground voltage; and
a fourth transistor including a gate connect to an output of the first NOR gate, a first terminal connected the fourth blocking signal, and a second terminal connected to a ground voltage.

10. The semiconductor memory device of claim 9, wherein, when the semiconductor memory device performs an active operation, the reference signal is in a first logic state, and when the semiconductor memory device performs a precharge operation, the reference signal is in a second logic state.

* * * * *